United States Patent [19]

Hastings

[11] Patent Number: 5,457,411

[45] Date of Patent: Oct. 10, 1995

[54] TRINARY LOGIC INPUT GATE

[75] Inventor: R. Alan Hastings, Allen, Tex.

[73] Assignee: Texas Instruments Incorporated, Dallas, Tex.

[21] Appl. No.: 348,633

[22] Filed: Dec. 2, 1994

[51] Int. Cl.⁶ .................................................. H03K 19/00
[52] U.S. Cl. ........................................... 326/59; 326/121
[58] Field of Search ..................................... 326/59, 121

[56] References Cited

U.S. PATENT DOCUMENTS

| | | | |
|---|---|---|---|
| 4,518,875 | 5/1985 | Aytac | 326/59 |
| 4,808,854 | 2/1989 | Reinagel | 326/59 |
| 4,823,028 | 4/1989 | Lloyd | 307/355 |
| 5,017,817 | 5/1991 | Yamakawa | 326/59 |
| 5,132,575 | 7/1992 | Chern | 326/59 |
| 5,198,707 | 3/1994 | Nicolai | 307/475 |
| 5,212,800 | 5/1994 | Mensch | 395/800 |
| 5,317,211 | 5/1994 | Tang et al. | 307/465 |

OTHER PUBLICATIONS

Mouftah, Design and Implementation of Three Valued Logic Systems with MOS Integrated Circuits IEE Proc. vol. 27, #4, Aug./1980.

*Primary Examiner*—Edward P. Westin
*Assistant Examiner*—Andrew Sanders
*Attorney, Agent, or Firm*—Mark E. Courtney; W. James Brady, III; Richard L. Donaldson

[57] ABSTRACT

A trinary input logic gate (25). A first output transistor (36) is coupled to a first voltage output ($V_{O1}$) and pulls the voltage output to a high voltage in response to a voltage input ($V_{IN}$) below a defined low threshold. A second output transistor (35) is coupled to a second voltage output ($V_{O2}$) and pulls the second voltage output to a low voltage in response to a voltage input above a defined high threshold. Swing limiting circuitry (28, 26) is coupled to the gates of both the first and second output transistors, and when the voltage input is between the defined thresholds, the swing limiting circuitry operates to keep the gates of the first and second output transistors within a middle range of defined thresholds such that both output transistors are enabled, and therefore the first and second voltage outputs are at opposite polarities. When the input voltage is above the high threshold, both outputs are at a low voltage. When the input voltage is below the low threshold, both outputs are at a high voltage. Thus the two voltage outputs can be used to receive and decode three distinct input states at the voltage input. The circuitry (25) is designed to provide adequate noise immunity and operate at low supply voltages, such as three volts. The circuitry is designed to be compatible with CMOS and BiCMOS digital logic semiconductor processes, and does not require additional reference voltages or any resistances. Additional embodiments are described.

25 Claims, 4 Drawing Sheets

FIG. 1
(PRIOR ART)
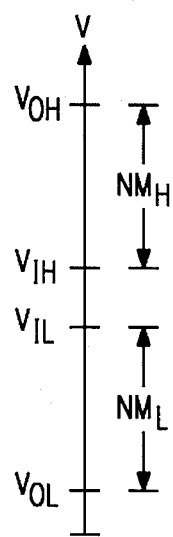
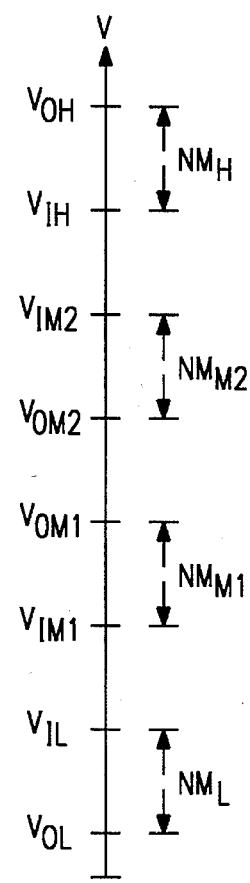
FIG. 2
(PRIOR ART)
FIG. 3
(PRIOR ART)
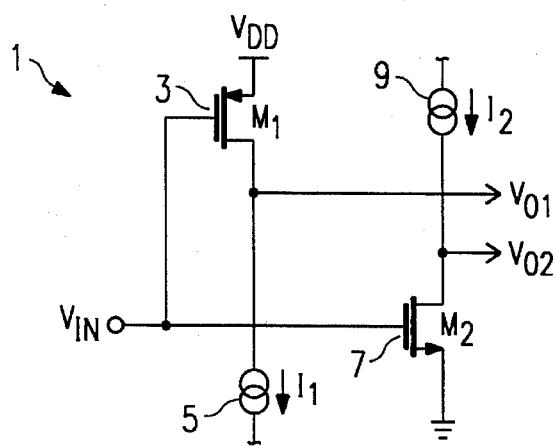
TRUTH TABLE

TRINARY LOGIC INPUT GATE

FIELD OF THE INVENTION

This invention relates specifically to the field of three state logic circuits, and generally to the fields of logic circuitry and integrated circuit design and fabrication.

BACKGROUND OF THE INVENTION

The background of the invention will be described in terms of the number of pins available on an integrated circuit. The number of transistors of a given size which can be packed onto a die of given size is directly proportional to the area of the die. In other words, a bigger silicon die gives proportionally more components. However, the number of pins which can be brought out of the package is limited by the number of bondwires which can be fastened to the die. Since the bondpads of an integrated circuit are typically arrayed around the periphery of the die, the number of bondpads grows in direct proportion to the perimeter of the die, or approximately as the square root of the area of the die. Thus, as the die grows larger, the number of package pins grows much more slowly than does the number of components.

As manufacturing technology improves, the component size of digital logic has steadily decreased. The number of components possible in a technology increases roughly as the inverse square of the lineal dimension of the components. Thus, reductions in component size allow vast increases in component count. Unfortunately, packaging technology is limited by the wire diameter which can be handled by the automated bonding machines. Wire diameter has not changed greatly over time, and so the number of wires which can be bonded to a die of given size has not increased greatly.

These facts lead to an unsettling conclusion. Despite the growth of logic component counts from approximately 100 components/die for SSI to over one million components per die for modern ASIC parts, the number of pins has increased only from 16 to perhaps 200 or so. As a result, the number of components per pin has risen from approximately 5 to about 5000. This fact places a premium on package pins. Since it seems unlikely that any revolutionary breakthrough in packaging will be made in the near future, pin count will continue to be a serious concern.

The usual solution in the prior art to integrated circuit pin limitations is to multiplex the functionality of the pins. Each pin performs multiple functions. In the case of data and address lines, multiplexing comes as a natural outgrowth of synchronous data transfer. However, many parts also require some pins to perform programming or initialization functions. For these pins, multiplexing is a much more questionable technique. The external circuitry connected to these pins should be as simple as possible; ideally simple jumpers to power supply or ground would be required. In many systems a microprocessor or microcontroller can be used to program the peripheral parts, but this requires that the peripherals be placed near the controlling chip, and this also limits the applicability of the peripheral to products not containing microprocessors or similar complex chips.

These considerations lead to the conclusion that some initialization pins cannot be multiplexed, and must instead be hard-wired to supplies, or connected to simple circuitry such as a resistor, a switch, or something of this order. For complex parts, a substantial number of initialization pins may be needed in order to convey enough information to start the system which the component controls. Since there is likely to be a premium on pins, trinary logic can be used to advantage in this situation. Trinary logic makes it possible for a single pin to receive three different input states, and therefore can extend the number of functions the pins of a device may support. For example, two trinary logic programming pins can support nine different input states, while two binary programming pins can only support four input states.

One problem that occurs in designing a trinary logic gate is that of noise margins. Noise margin problems may be best understood by first considering the common binary logic gate as an example. In a binary logic gate, one of two input voltages is recognized at a voltage input and a corresponding output is produced. The input voltage is said to be at a logic high or a logic low. Physically this means that the voltage exceeds a threshold set for a logic high, or is below a threshold set for a logic low voltage. The binary logic gate will recognize an input signal and will produce a definite response so long as the input signal satisfies the inequalities:

$$(Vi>Vi_H) \text{ or } (Vi<Vi_L) \quad [1]$$

Furthermore, each output generated in response to a set of inputs meeting the requirements of [1] will obey the inequalities:

$$(Vo>Vo_H) \text{ or } (Vo<Vo_L) \quad [2]$$

The input high voltage $Vi_H$, input low voltage, $Vi_L$, output high voltage $Vo_H$ and output low voltage $Vo_L$ satisfy the following inequalities:

$$Vo_H>Vi_H>Vi_L>Vo_L \quad [3]$$

A pair of noise margins $NM_H$ and $NM_L$ are defined in terms of the above quantities:

$$\left.\begin{array}{l} NM_H = Vo_H - Vi_H \\ NM_L = Vi_L - Vo_L \end{array}\right\} \quad [4]$$

The noise margins can be seen as a measure of the noise immunity of the binary gate. So long as the level of noise on a high-level signal never exceeds $NM_H$, and the level of noise on a low-level signal never exceeds $NM_L$, the gates of the system will operate reliably. It follows that the separation of $Vo_H$ and $Vo_L$ should be as large as possible, while the separation of $Vi_H$ and $Vi_L$ (the transition region of the gate) should be as small as possible. The relationships described above are graphically illustrated in FIG. 1.

Binary logic defines only two states, a high state ($Vi>Vi_H$, $Vo>Vo_H$) and a low state ($Vi>Vi_L$, $Vo>Vo_L$). It is possible to define logic families with more than two states, such as the one referred to herein as trinary logic, which incorporates three states. Trinary logic gates will recognize a signal and will produce a definite response as long as:

$$(Vi>Vi_H) \text{ or } (Vi<Vi_{M2} \text{ and } Vi>Vi_{M1}) \text{ or } (Vi<Vi_L) \quad [5]$$

Furthermore, outputs generated in response to a set of inputs obeying the above inequality will satisfy the inequalities:

$$(Vo>Vo_H) \text{ or } (Vo<Vo_{M2} \text{ and } Vo>Vo_{M1}) \text{ or } (Vo<Vo_L) \quad [6]$$

The output and input voltages must satisfy the following inequality:

$$Vo_H > Vi_H > Vi_{M2} > Vo_{M2} > Vo_{M1} > Vi_{M1} > Vi_L > Vo_L \qquad [7]$$

Four noise margins can be defined for trinary logic, in a manner analogous to binary logic. These are as follows:

$$\left.\begin{array}{l} NM_H = Vo_H - Vi_H \\ NM_{M2} = Vi_{M2} - Vo_{M2} \\ NM_{M1} = Vo_{M1} - Vi_{M1} \\ NM_L = Vi_L - Vo_L \end{array}\right\} \qquad [8]$$

FIG. 2 depicts these relationships in a graphical form. The inequality of equation [8] indicates that there is a middle range of inputs that has to be recognized by a trinary input gate, in addition to the high and low voltages. The existence of four noise margins in trinary logic implies that the noise immunity of this logic for a given voltage range may be less than that of binary logic. This is not necessarily true, as a more complete analysis of noise presented in a later section will show. However, the additional complexity of trinary logic does place it at a significant disadvantage when compared to binary logic. For this reason, little trinary logic (or any higher-order logic) has been used.

There are several approaches in the prior art to providing a trinary logic input capability. A simple prior art trinary input logic gate which meets many of the above requirements is shown in FIG. 3. The circuit 1 consists of a PMOS-logic inverter comprised of transistor 3 and current source 5 and an NMOS-logic inverter comprised of transistor 7 and current source 9 which are both connected to the input, Vin, and which generate separate binary outputs $V_{O1}$ and $V_{O2}$. The current sources are fabricated by any means available in the process, for example current mirrors driven by a bias circuit, or depletion-mode loads, or even simple resistive loads could be used.

The truth table also shown in FIG. 3 depicts the logical operation of the logic gate 1 for three input voltages. If the input at the Vin terminal is a low voltage, the outputs are both high. If the input at the Vin terminal is a high voltage, the outputs are both low. If the input is driven to a midrange voltage, the output is high for the PMOS gate and low for the NMOS gate, that is both output transistors are on.

The input voltage thresholds of the circuit 1 depicted in FIG. 3 are relatively easy to calculate. Suppose, for the purposes of analysis, that current sources 5 and 9 are perfect current sources. Transistors 3 and 7 are MOSFETs described by the Shichman-Hodges equation:

$$I_d = \frac{k}{2}(V_{gs} - V_t)^2 \text{ (saturation region)} \qquad [9]$$

where k is the transconductance of the MOS transistor (k'·W/L), and Vt is the threshold voltage of the transistor. Suppose that the output $V_{O1}$ of the PMOS gate has a transition point at ½ of the supply voltage $V_{dd}$; that is to say that $Vi_H$ and $Vi_L$ of the following binary gate will (neglecting process shifts) both be set at ½ the supply. This is a transition voltage compatible with common CMOS logic. Then, at the point where the PMOS inverter switches the following binary gate, transistor 3 can be assumed to be operating in saturation. The input voltage necessary to reach this transition point is then:

$$Vin_H = Vdd - \sqrt{\frac{2 \cdot I_1}{k_1}} - Vt_1 \qquad [10]$$

This equation can be interpreted as a best-case value for $Vi_H$ and $Vi_{M2}$ for the trinary input (process variations will, of course, cause shifts which will force $Vi_{M2}$ to be lower, and $Vi_H$ to be higher, than Vin(H)). A similar analysis can be performed for the NMOS inverter:

$$Vin_L = \sqrt{\frac{2 \cdot I_2}{k_2}} + Vt_2 \qquad [11]$$

This equation can be interpreted as a best-case value for $Vi_L$ and $Vi_{M1}$ for the trinary input.

The noise margins for the above gate are dependent upon supply voltage. The voltages Vin(L) and Vin(H) are both on the order of 1–2 V for typical digital MOS transistors, so a supply voltage of 5 V will give roughly equal values for all noise margins of the trinary gate. A 3 V power supply will not operate the trinary gate with satisfactory noise margins, which severely limits its applicability to modern digital systems. This is unsurprising, as trinary logic inherently has noise margin limitations which are more severe than those imposed upon binary logic. Another limitation of the prior art gate 1 of FIG. 3 is that it requires a mid-range supply to generate the mid-state (M in the logic table of FIG. 3). A mid-range supply is not necessarily available, especially in an all-digital system. This gate offers simplicity and small size, as it can be implemented in four transistors if depletion loads are available, and it is compatible with many processes including pure digital CMOS processes. It also offers relatively low supply currents, depending upon the values chosen for $I_1$ and $I_2$. However, due to limited noise margins, inability to operate from 3 V logic, and the need for a mid-range supply, it is clearly unsuitable for use with all digital CMOS applications, especially where a low supply voltage is to be used.

A second prior art design approach to a trinary logic input gate is depicted in FIG. 4. In FIG. 4, gate 11 comprises a resistive voltage divider of resistors 13 and 15 coupled to the input terminal Vin, a PMOS inverter circuit made up of PMOS transistor 19 and current source 17, and an NMOS inverter circuit made up of NMOS transistor 23 and current source 21. Again, the circuit outputs a PMOS output voltage $V_{O1}$, and an NMOS output voltage $V_{O2}$. Although the truth table is not repeated, this circuit operates logically in exactly the same manner as the circuit of FIG. 3.

In operation, the resistors of FIG. 4 provide the mid-range voltage Vm to the input terminal when the input is not driven. Otherwise, the operation of the circuit of FIG. 4 is exactly the same as that in FIG. 3. It could be argued that this circuit implementation solves the problems associated with the circuit of FIG. 3. While this is true in some respects, resistors have a number of severe disadvantages, especially in terms of integrated circuit implementations. In order to limit the current consumption of the gate 11 to a reasonable value, the resistors 13 and 15 must have very large values. For example, to limit the current flow to 5 µA with a supply of 5 V, a total of one megohm of resistance is required. In a typical CMOS process, where resistors are fabricated from gate polysilicon with a sheet resistance of about 10 Ohms/square, this means that some 100,000 squares of resistance material would be required, which would require vast amounts of silicon area..Also, resistors are not compatible with all semiconductor processes. For example, a clad-gate CMOS process may have no suitable polysilicon resistors, forcing so-called well resistors to be used; these may be extremely large and therefore impracticable. Also, use of a resistor bias network ensures that Idd will vary with Vdd, which is undesirable for input gates which may operate over a wide range of voltages. For instance, a gate which is designed to operate over the voltage range $3 < V_{dd} < 15$ V will exhibit a 5:1 variation of supply current over the voltage range. This variation with power supply results in excessive and undesirable power consumption at the high end of the supply voltage range.

The prior art circuits of FIGS. 3 and 4 are typical of existing implementations of trinary input gates, and illustrate the severe shortcomings of the existing implementations. Other more complicated solutions have also been attempted. For example, U.S. Pat. No. 5,198,202, issued Mar. 30, 1993, and entitled "Integrated Circuit with Mode Detection Pin for Tristate Level Detection", and herein incorporated by reference, discloses a circuit for detecting a high impedance or undriven condition at an input pin. This circuit requires not only an internal resistor, but also four switches, sequencing circuitry for controlling the switches, a memory with at least two locations, and a two bit to three bit decoder for outputting the result. Additionally, the input signal is required to remain in a given state for a relatively long period, as the sequencer must operate the switches into two different positions and sample the input into the two memory locations before a determination of the voltage at the input can be made. An alternative prior art approach, but no less complex, is described in U.S. Pat. No. 5,212,800, issued May 18, 1993, and entitled "Method and Apparatus for Sensing Trinary Logic States in a Microcomputer using Bus Holding Circuits". In this approach, a pair of tristate buffers is required and are coupled to the input and the output, respectively, of a binary latch memory. The condition of the input is used to determine whether the output should be driven to a high or a low logic voltage, or tristated itself. Again, this approach requires a substantially long time to make a determination as to the voltage at the input, and many components, which require area on the silicon substrate and power to operate. None of the prior art solutions described above provides a practical trinary input gate.

A need for a simple trinary input gate which can be used to decode trinary-logic input pins for integrated circuits and which is compatible with CMOS semiconductor process steps without the need for additional masks or processing steps thus exists.

SUMMARY OF THE INVENTION

A trinary input logic gate for receiving trinary input signals and outputting binary outputs corresponding to three input states is described. The trinary input logic gate is designed to be fully compatible with standard CMOS and BiCMOS semiconductor processes, and operates without the need for additional voltage references or on-board resistors. First and second output transistors are each coupled between power supplies and a voltage output terminal, and each have their gates coupled to a voltage input terminal. The first output transistor pulls up the first output terminal to a high voltage when the voltage input terminal is below a defined low logic voltage threshold, and the second output transistor pulls down the second output terminal to a low voltage when the voltage input terminal is above a defined high logic voltage threshold. Bias circuitry is coupled to the voltage input terminal, so that when the voltage input terminal is disconnected and allowed to float or is at a middle voltage, the terminal is allowed to range between a defined midrange low voltage threshold and a defined midrange high voltage threshold. The output transistors and the bias circuitry are designed such that when the input terminal is not driven or is driven in the midrange input voltages, the two voltage output terminals are unequal. When the input terminal is driven high, or driven low, both voltage output terminals are equal and inverted from the input. In this manner three distinct input states on a single pin can be received and used by the receiving device. The trinary input gate circuitry is further designed to have adequate noise immunity when used in a low supply situation, and does not require a mid-range voltage reference or integrated resistors. Additional embodiments are described.

BRIEF DESCRIPTION OF THE DRAWINGS

FIG. 1 depicts the voltage thresholds for a binary logic gate;

FIG. 2 depicts the voltage thresholds for a trinary logic gate;

FIG. 3 (prior art) depicts the input-output state table and circuit schematic for a trinary logic gate;

Corresponding numerals and symbols in the different figures refer to corresponding elements unless otherwise indicated.

DETAILED DESCRIPTION OF PREFERRED EMBODIMENTS

Figure 5:
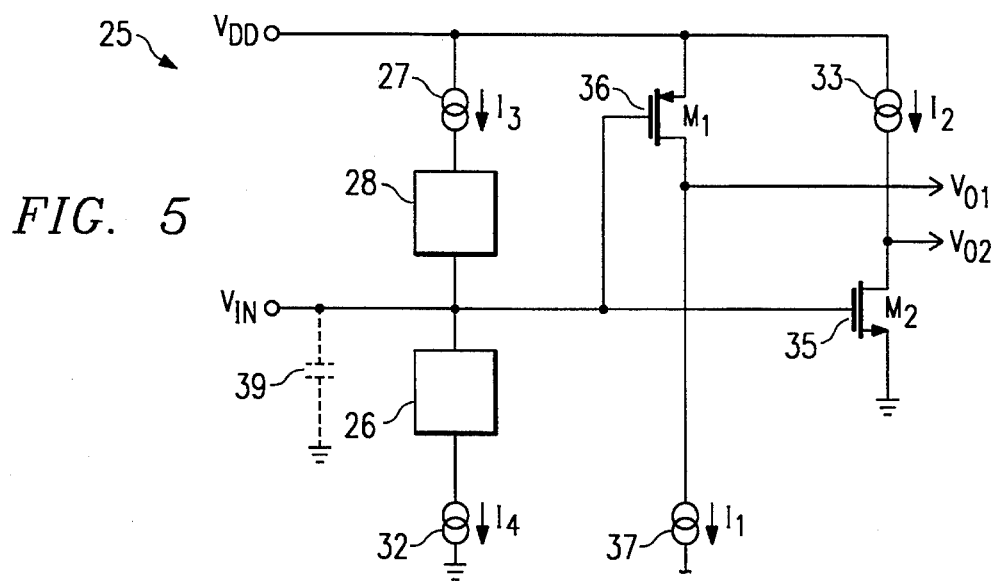
FIG. 5 depicts the circuit schematic for a first preferred embodiment of a trinary input logic gate incorporating the circuitry of the invention.

FIG. 5 depicts a first preferred embodiment of a trinary logic gate incorporating the circuitry and advantages of the invention. In FIG. 5, input gate 25 comprises a voltage input terminal Vin, a PMOS inverter circuit comprised of PMOS transistor 36 and current source 37, and an NMOS inverter circuit comprised of NMOS transistor 35 and current source 33. Output terminal $V_{o1}$ coupled to the PMOS inverter, and output terminal $V_{o2}$ is coupled to the NMOS inverter. Additionally, gate 25 comprises bias circuitry including a current source 27, a first swing limiting circuit 28, a current source 32, and a second swing limiting circuit 26. Optional decoupling capacitor 39 is shown coupled to the input Vin.

Figure 4:
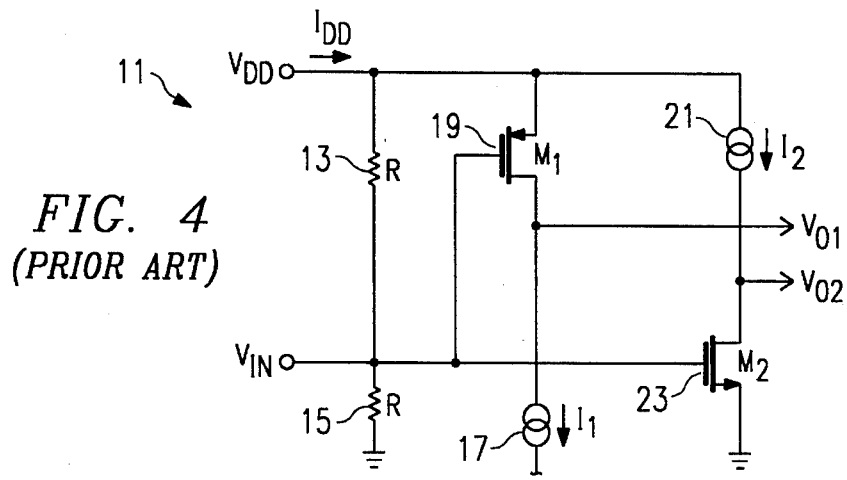
FIG. 4 (prior art) depicts a circuit schematic for another trinary logic gate.

In operation, the logical operation of the gate 25 in FIG. 5 is the same as for the prior art trinary input gates of FIG. 3 and FIG. 4; that is the truth table of FIG. 3 depicts the logical output values of the circuit of FIG. 5. When a low voltage is placed at the input terminal Vin, the PMOS transistor 36 is enabled and the output terminal $V_{o1}$ is pulled up to a high voltage. The NMOS transistor 35 is disabled, so the output terminal $V_{o2}$ is also a high voltage. When the input terminal Vin is driven to a high voltage, the PMOS transistor 36 is shut off and the output terminal $V_{o1}$ is pulled down to a low voltage. The NMOS transistor 35 is enabled and the output terminal $V_{o2}$ is also a low voltage. So for these cases both output terminals $V_{o1}$ and $V_{o2}$ will transmit in inverted signal from the input terminal Vin. When the input terminal is allowed to float, that is undriven or driven by a tristated driver, the bias circuit consisting of current sources 27 and 32 and swing limiting circuits 28 and 26, is used to maintain the input terminal at a midrange voltage.

The truth table of FIG. 3 indicates that for the midrange case, output terminal $V_{o1}$ should be a high voltage and output terminal $V_{o2}$ should be a low voltage. This means that both output transistors 35 and 36 are enabled. The swing limiting circuits 28 and 26 are designed to hold the input terminal within the midrange voltages defined by the desired noise margins when the input terminal is undriven or at a high impedance. The input terminal Vin must not rise to a voltage which will cut off PMOS transistor 36, also labeled M1, or fall below a voltage which will cut off NMOS transistor 35, also labeled M2.

Figure 6:
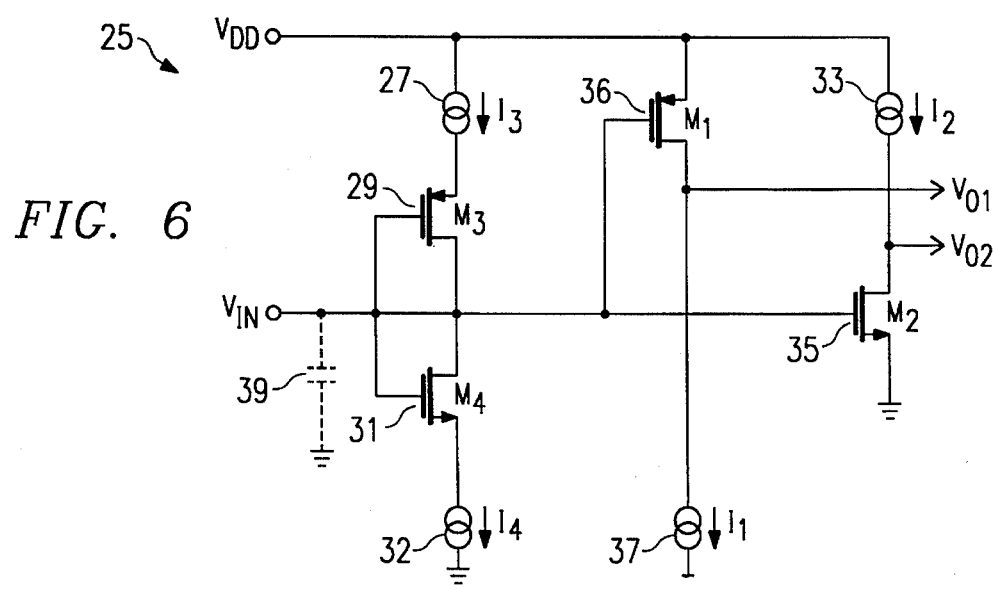
FIG. 6 depicts a more detailed circuit schematic for a first preferred embodiment of a trinary input logic gate incorporating the circuitry of the invention.

FIG. 6 depicts a detailed schematic of the first preferred embodiment of a trinary logic gate incorporating the circuitry and advantages of the invention. In FIG. 6, input gate 25 comprises a voltage input terminal Vin, a PMOS inverter circuit comprised of PMOS transistor 36 and current source 37, and an NMOS inverter circuit comprised of NMOS transistor 35 and current source 33. Output terminal $V_{o1}$ is coupled to the PMOS inverter, and output terminal $V_{o2}$ is coupled to the NMOS inverter. Additionally, gate 25 comprises bias circuitry including a current source 27, and the swing limiting circuit 28 of FIG. 5 is implemented by a PMOS transistor 29, a current source 32, and the swing limiting circuit 26 of FIG. 5 is now implemented by an NMOS transistor 31. Optional decoupling capacitor 39 is shown coupled to the input Vin.

In operation, the logical operation of the gate 25 in FIG. 6 is the same as for the circuit of FIG. 5. When a low voltage is placed at the input terminal Vin, the PMOS transistor 36 is enabled and the output terminal $V_{o2}$ is pulled up to a high voltage. The NMOS transistor 35 is disabled, so the output terminal $V_{o2}$ is also a high voltage. When the input terminal Vin is driven to a high voltage, the PMOS transistor 36 is shut off and the output terminal $V_{o1}$ is pulled down to a low voltage. The NMOS transistor 35 is enabled and the output terminal $V_{o2}$ is also a low voltage. So for these cases both output terminals $V_{o1}$ and $V_{o2}$ will transmit an inverted signal from the input terminal Vin. When the input terminal is allowed to float, that is undriven or driven by a tristated driver, the bias circuit consisting of swing limiting transistors 29 and 31, and current sources 27 and 32, is used to maintain the input terminal at a midrange voltage. The truth table of FIG. 3 indicates that for the midrange case, output terminal $V_{o1}$ should be a high voltage and output terminal $V_{o2}$ should be a low voltage. This means that both output transistors 35 and 36 are enabled.

The circuit of FIG. 6 represents an improved trinary input gate over the prior art solutions. A bias network comprised of two current sources 27 and 32 and two MOS transistors 29 and 31 is connected to the input Vin of the gate 25. When the gate is in the midrange state, the current source 27 produces current I3 into transistor 29, which is connected as a diode coupled transistor. The purpose of these two elements is to ensure that while the input terminal Vin is floating, it cannot rise to a point so close to Vin that the PMOS transistor 36 shuts off, that is the inequalities of equation 7 are satisfied in that the input voltage is less than $V_{im_2}$. The gate to source voltage drop Vgs of transistor 29 is used to ensure that the voltage at the gate of the PMOS output transistor 36 does not reach the shutoff threshold. Similarly, the current source 32 and transistor 31 are used to prevent the input voltage Vin from falling so close to the threshold Vil that the NMOS output transistor 35 shuts off, that is the voltage is clamped above the voltage $V_{im_1}$. The voltage drop Vgs of transistor 31 will clamp voltage Vin at a point above the threshold voltage for NMOS transistor 35, so it will not shut off. In operation, the function of the bias network of current sources 27 and 32 and transistors 29 and 31 in FIG. 6 is twofold: first, when the input Vin of the gate is left unconnected, the bias network ensures that the gate will assume the midrange state; and second, the bias network provides sufficient input noise immunity to allow operation of the gate from a 3 V, or lower, supply voltage. Although the swing limiting circuitry could be implemented from other components, e.g. junction diodes, the use of the diode connected transistors 29 and 31 will enhance the noise immunity for the circuit, as will be shown below.

In order to further explain the operation and advantages of the preferred embodiment of FIG. 6, a simplified analysis is first presented to show the general behavior of the gate, and then a more complete analysis of one implementation of this gate will be used to analyze noise immunity. For the purposes of the simplified analysis, assume that all four current sources provide equal and constant current ($I_1=I_2=I_3=I_4$). Although an ideal current source has infinite compliance, real current sources have limited compliance, and the bias network makes use of this fact. For purposes of this simplified analysis, assume $I_1$ and $I_4$ can pull to ground and $I_2$ and $I_3$ can pull to $V_{dd}$ before the respective current sources saturate, whereupon the current supplied by the respective source abruptly drops to zero.

The voltage input thresholds Vin(H) and Vin(L) of the improved gate are the same as those of the simple prior art trinary gate of FIG. 3, as described above. In order for the gate 25 to work properly when the input is disconnected, the bias network of elements 27, 29, 31 and 32 must hold the input voltage Vin at a midrange voltage between Vin(L) and Vin(H). The bias network limits the swing of the input due to the existence of the swing limiting transistors 29 and 31, labeled M3 and M4 in the figures. Applying the Shichman-Hodges equation [9] to these transistors, the following inequality can be obtained:

$$Vdd - \sqrt{\frac{2I_3}{k_3}} - Vt_3 < Vin < \sqrt{\frac{2I_4}{k_4}} + Vt_4 \qquad [12]$$

Combining the inequality above with equations [10] and [11], the criteria for proper operation become:

$$Vdd - \sqrt{\frac{2I_1}{k_1}} - Vt_1 > Vdd - \sqrt{\frac{2I_3}{k_3}} - Vt_3 \qquad [13]$$

$$\sqrt{\frac{2I_1}{k_2}} + Vt_2 < \sqrt{\frac{2I_4}{k_4}} + Vt_4$$

Because of the nature of integrated circuits, the threshold voltages of similar devices will closely match. Thus, the PMOS transistors M1 and M3 will have thresholds $Vt_1=Vt_3$ and similarly the NMOS transistors M2 and M4 will have thresholds $Vt_2=Vt_4$. In addition, due to the simplifying assumptions made at the beginning of this analysis, all four drain currents are now equal. Therefore, the above inequalities merely reduce to:

$$k_1 > k_3, \; k_2 > k_4 \qquad [14]$$

This can be further simplified by noting that $k=(W/L) \cdot k'$, where $k'$ is the intrinsic transconductance of the MOS device, and W/L is the ratio of effective channel width W to effective channel length L. Intrinsic transconductances of similar devices match very closely, so it can be said that $k'_2=k'_4$ and $k'_1=k'_3$. Therefore equation 14 simply reduces to the demand:

$$\left(\frac{W}{L}\right)_1 > \left(\frac{W}{L}\right)_3 \text{ and } \left(\frac{W}{L}\right)_2 > \left(\frac{W}{L}\right)_4 \qquad [15]$$

for transistors M1, M3, M2 and M4 in FIG. 6. This requirement can be easily satisfied by proper scaling of transistors 36, 35, 29 and 31. The above analysis is also applicable to the case where the current sources have non-zero saturation voltages, that is $I_1$ and $I_4$ pull down to a voltage $V_{satn}$ and $I_2$ and $I_3$ pull up to a voltage $V_{dd}-V_{satp}$. In this case, the inequalities given above are sufficient to ensure proper operation, although they are not strictly necessary (in other words, an implementation could violate these inequalities and still marginally function). The analysis is also easily extended to cases where the four currents are not all equal, specifically to the case where currents $I_1$ and $I_2$ are scaled. Scaling the transistors appropriately will compensate for nonequal current sources.

This analysis shows that the bias network comprised of swing limiting transistors 29 and 31 and current sources 27 and 32 does indeed hold the input Vin to a range of voltages which correspond to the midrange state of the trinary input gate 25.

Further analysis is required to demonstrate that the noise immunity obtained using the trinary gate of FIG. 5 will allow the gate to operate properly in low supply voltage systems, for example in a digital system using a supply voltage of 3 V. The trinary gate is intended to be used for programming and initialization of integrated circuits. In this application, its input will be connected to supply ($V_{dd}$), ground (0 V), or it will be left open. Two of the four noise margins are easily determined, with reference to inequality [8] and equations [10] and [11]; these are:

$$\begin{aligned} NM_H &= V_{dd} - Vin(H) \\ NM_L &= Vin(L) \end{aligned} \qquad [16]$$

Both of these noise margins $NM_H$ and $NM_L$ will be in excess of a transistor threshold voltage Vt, and since the threshold voltage for a typical MOS process is about 0.7 V, this will give more than 250 mV of noise margin over temperature and process variation. Since the input is hardwired to either power supply or ground for both of the noise margin measurements given above, the input impedance will be very low and 250 mV will be more than adequate noise margin. If, for some reason a larger noise margin is needed, manipulation of device transconductances can increase the noise margins substantially.

The noise margins $NM_{M1}$ and $NM_{M2}$ require additional consideration. In the simple prior art trinary gate, a midrange supply was used, and these noise margins could then be defined in terms of the midrange supply. But at Vdd=3 V, with worst-case temperature and process assumptions, these noise margins become very difficult to sustain. In the improved trinary gate 25, there is no midrange supply, so $NM_{M1}$ and $NM_{M2}$ are set up by the bias network consisting of transistors 29 and 31 and current sources 27 and 32. Since the input Vin is left unconnected, the voltage which appears on this terminal is dependent upon whatever charge can be injected into the input by various coupling processes.

There are two types of charge injection mechanisms which must be considered: AC currents which flow into the input terminal Vin in response to RFI, crosstalk from nearby signals, and switching transients, for example; and DC currents which flow into the pin due to package and interconnection current leakages. Each type of charge injection mechanism can be analyzed separately.

AC currents will typically be thin spikes at very high frequencies, caused by clock edge transitions and switching in nearby and closely-associated circuitry. Since the unconnected pin of the package has a relatively low capacitive coupling to these noise sources, very little charge is actually injected by any one event. Therefore, a decoupling capacitor of a few picofarads can be placed between Vin and ground to effectively eliminate the possibility of AC transient-induced upsets. For the simplest and smallest circuit, the gate capacitance of transistors 36 and 35 may provide enough capacitance to decouple the input. If circuit analysis indicates that the gate capacitance of the output transistors is inadequate, additional capacitance can be added. Capacitor 39 in FIG. 5 is shown as an optional added element. This capacitor is compatible with any process which can fabricate the trinary gate, as gate capacitance of a MOS transistor is a viable option for the capacitor if no higher capacitance-per-unit-area device is available. Well known circuit design techniques are used to determine what value of capacitance is needed for capacitor 39. In extreme cases, an external decoupling capacitor might be added, but few applications are likely to require it.

DC currents which inject charge into the input pin Vin when it is undriven will typically be constant currents, and these cannot be eliminated by decoupling capacitance. The trinary input gate 25 must be designed to withstand the maximum probable leakage current without causing a circuit upset, that is, without causing an erroneous state change at the outputs $Vo_1$ and $Vo_2$. The design requirements for this condition to be met can be obtained mathematically by extending the analysis given above by incorporating a leakage current term. Taking inequality [12] and adding a leakage current $I_L$ which acts to degrade the noise immunity of the gate, a new set of inequalities is obtained:

$$Vdd - \sqrt{\frac{2(I_3 - I_L)}{k_3}} - Vt_3 < Vin < \sqrt{\frac{2(I_4 - I_L)}{k_4}} + Vt_4 \qquad [17]$$

These equations can be combined with the equations for Vin(H) and Vin(L) to form new inequalities:

$$Vdd - \sqrt{\frac{2I_1}{k_1}} - Vt_1 > Vdd - \sqrt{\frac{2(I_3 - I_L)}{k_3}} - Vt_3 \qquad [18]$$

$$\sqrt{\frac{2I_2}{k_2}} + Vt_2 < \sqrt{\frac{2(I_4 - I_L)}{k_4}} + Vt_4$$

As before, simplifying assumptions can be made ($Vt_1=Vt_3$, $Vt_2=Vt_4$, $k'_1=k'_3$, $k'_2=k'_4$):

$$\left(\frac{W}{L}\right)_1 > \left(\frac{W}{L}\right)_3 \cdot \left(\frac{I_1}{I_3 - I_L}\right) \qquad [19]$$

$$\left(\frac{W}{L}\right)_2 > \left(\frac{W}{L}\right)_4 \cdot \left(\frac{I_2}{I_4 - I_L}\right)$$

The above inequalities allow the computation of transistor device W and L values which ensure that the trinary gate can withstand a leakage current $I_L$ without error. These equations presume that $I_3 > I_L$ and $I_4 > I_L$; so these currents may also need to be increased. For a practical implementation, the device currents must be several times the expected leakage currents. Since leakage currents at an unconnected pin are usually specified as about 1 μA, the currents in the bias chain ($I_3$ and $I_4$) should be set to at least several microamps to limit the impact of leakages.

The above analysis shows that the trinary gate of the preferred embodiment of FIG. 6 has sufficient noise immunity for it to function in its intended role even at reduced supply voltages. For example, with a typical CMOS threshold voltage Vt of 0.7 V, a supply voltage of 3 Volts will be sufficient to operate the trinary gate. It is important to note that two of the noise margins for the improved trinary gate are expressed as voltages ($NM_L$ and $NM_H$) and two of the noise margins are expressed as currents ($NM_{M1}$ and $NM_{M2}$); the latter two are assumed in the above analysis to be equal to the maximum leakage current for the application, $I_L$.

Figure 7:
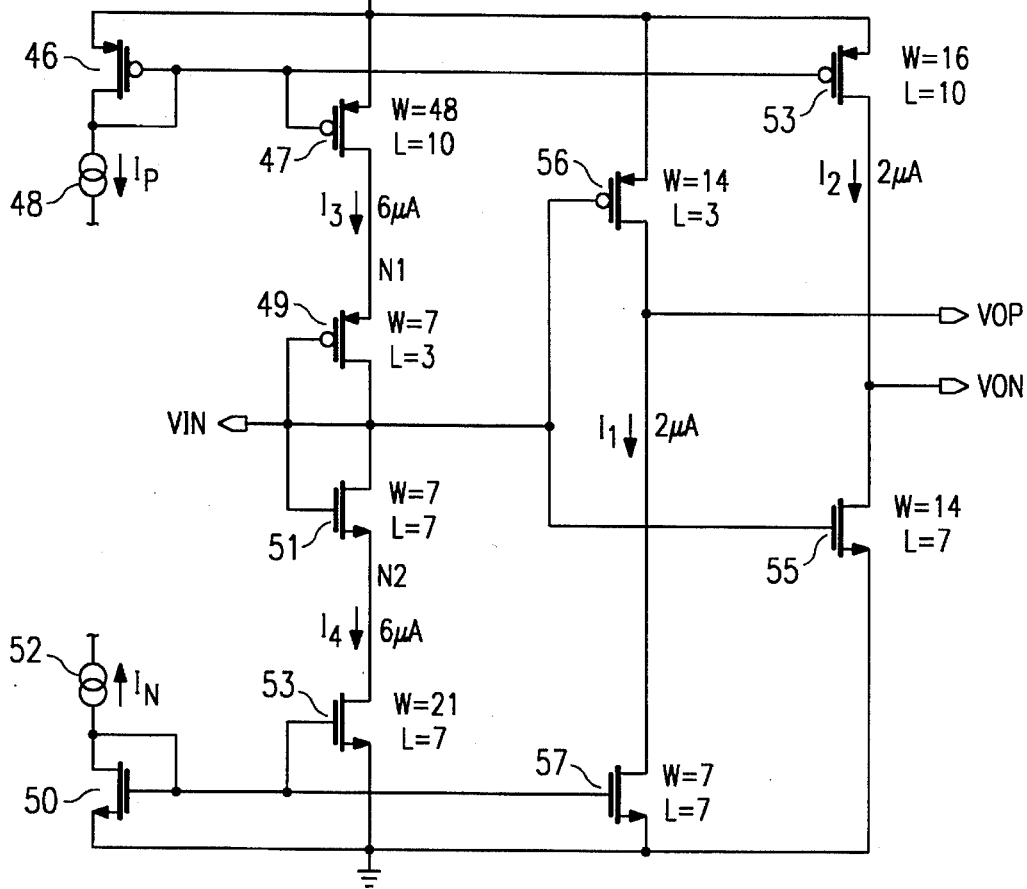
FIG. 7 depicts a circuit schematic of another preferred embodiment of a trinary input logic gate incorporating the circuitry of the invention.

FIG. 7 depicts a detailed circuit implementation of the trinary input gate of FIG. 6 for use in a specific CMOS process. In FIG. 7, logic gate 45 is comprised of a PMOS output transistor 56 coupled between a positive bias supply voltage Vdd and a first output terminal Vop. Current source transistor 57 is coupled to output terminal Vop and to ground. A NMOS output transistor 55 is coupled between a second output terminal Von and ground. Current source transistor 53 is coupled to output terminal Von and to the positive bias supply voltage Vdd. Input terminal Vin is coupled to the gates of both PMOS output transistor 56 and NMOS output transistor 55. Bias circuitry is coupled to the input terminal Vin, as before. In FIG. 7, current source transistor 47 is coupled to diode connected transistor 49 and the two elements 47 and 49 couple the input terminal Vin to the positive voltage supply Vdd and provide the swing limiting circuitry for the PMOS inverter. Terminal Vin is also coupled to diode connected transistor 51 which with current source transistor 52 couples the input terminal to ground and provides the swing limiting circuitry for the NMOS inverter.

The operation of the circuit of FIG. 7 is the same in all respects as that of FIGS. 5 and 6. The current sources are PMOS or NMOS transistors which have their gates coupled to current mirror transistors 46 and 50, respectively. These current mirrors are biased by current sources 48 and current IP, and current source 52 and current IN. The use of controlled bias currents to control the gates of the current source transistors 47, 52, 53 and 57 allows the currents I1, I2, I3 and I4 to be controlled. In FIG. 6, I1 and I2 are both designed at 2 microamps, and I3 and I4 are both designed at 6 microamps. The use of the higher currents for I3 and I4 maintains the noise immunity when a leakage current $I_L$ is present, as discussed in the analysis above.

Note also the size ratios of transistors 49, 51, 56 and 55. These transistors have been sized to meet the inequality demand extracted above to ensure proper operation of the gate. For example, NMOS output transistor 55 has a w/l ratio of 2.0. Transistor 51 has a w/l ratio of 1.0. The NMOS output transistor has a 2/1 size increase over the NMOS diode connected transistor, as required by the inequality. For the PMOS output transistor 56, the W/L ratio is 14/3, or 4.67. The corresponding diode connected transistor is transistor 49, which has a w/l ratio of 7/3, or 2.33. So again the inequality is met with the output transistor having a 2/1 size increase over the diode connected transistor. Many other scaling alternatives are available, but clearly the gate of FIG. 7 meets the requirements for proper operation as expressed in the inequalities.

The circuit implementation of FIG. 7 has additional advantages in process variation immunity. Because the current sources and the transistors are all built using similar components, variations in threshold voltage and transconductance will be automatically compensated for. For example, if the PMOS transistors have a low Vt, the output driving transistor 56 can see a higher voltage at its gate before shutting off. The diode clamping transistor 49 will also have a low Vt, allowing the Vin voltage to rise farther in the undriven state. In contrast, if the PMOS transistors are built with a high Vt, the PMOS output transistor 56 will shut off earlier when the input voltage is allowed to rise in the midrange case. The diode clamping transistor 49 will also have a strong Vt, so it will cause the Vin terminal to stop rising at an earlier point, thereby automatically compensating for the process variations. Similar compensation mechanisms occur with the current source transistors, so the circuit of FIG. 7 will operate correctly independently of process variations.

Figure 8:
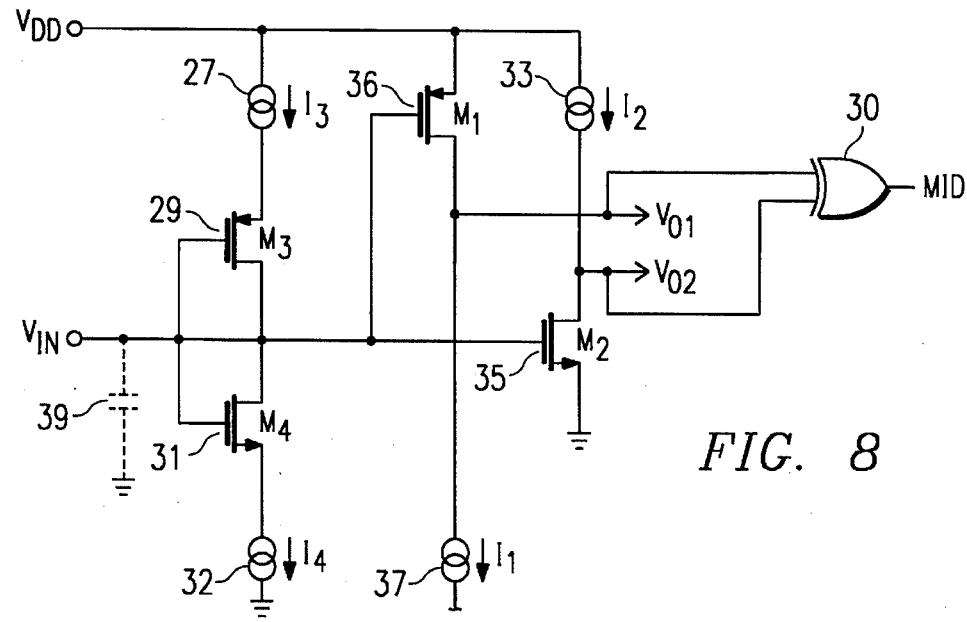
FIG. 8 depicts a circuit schematic of a third preferred embodiment of a trinary logic gate incorporating the invention.

FIG. 8 depicts the circuit of FIG. 6 with an additional output MID and element 30 and implements an additional advantageous feature of the invention. Because the trinary gate 25 has two outputs which indicate three possible states at the input, the gate can be used as a open input condition detector. The exclusive OR gate 30 of FIG. 8 provides an output MID that indicates when an open condition exists. In operation, the circuit of FIG. 5 provides the output values of the truth table of FIG. 3 on outputs $V_{o1}$ and $V_{o2}$. Clearly, whenever the input terminal Vin is a low or high, both outputs $V_{o1}$ and $V_{o2}$ are equal and inverted from the input. Thus the trinary gate 25 provides two outputs both of which are inverters.

Consider the operation of the circuit in FIG. 8 in a case where a bond wire has failed, or alternatively a circuit fault outside the integrated circuit has occurred and no signal is provided at the input pin Vin. The voltage terminal Vin is now floating and the bias circuit elements of gate 25 will place Vin at its midrange voltage, as before. $V_{o1}$ will be a high voltage, and $V_{o2}$ will be a low voltage. Exclusive OR gate 30 will now output a high voltage on signal MID. This output can be used to indicate to on board fault detection circuitry that the circuit or system is not operating correctly, since the trinary gate can detect a voltage level which indicates a fault state in conventional binary logic, which should not dwell for any length of time at the midrange voltage.

The circuit of FIG. 8 can also be used within an integrated circuit to indicate when an input is tristated by an external device. The integrated circuit could then determine when it is safe to drive that pin without causing a bus clash, for example.

Figure 9:
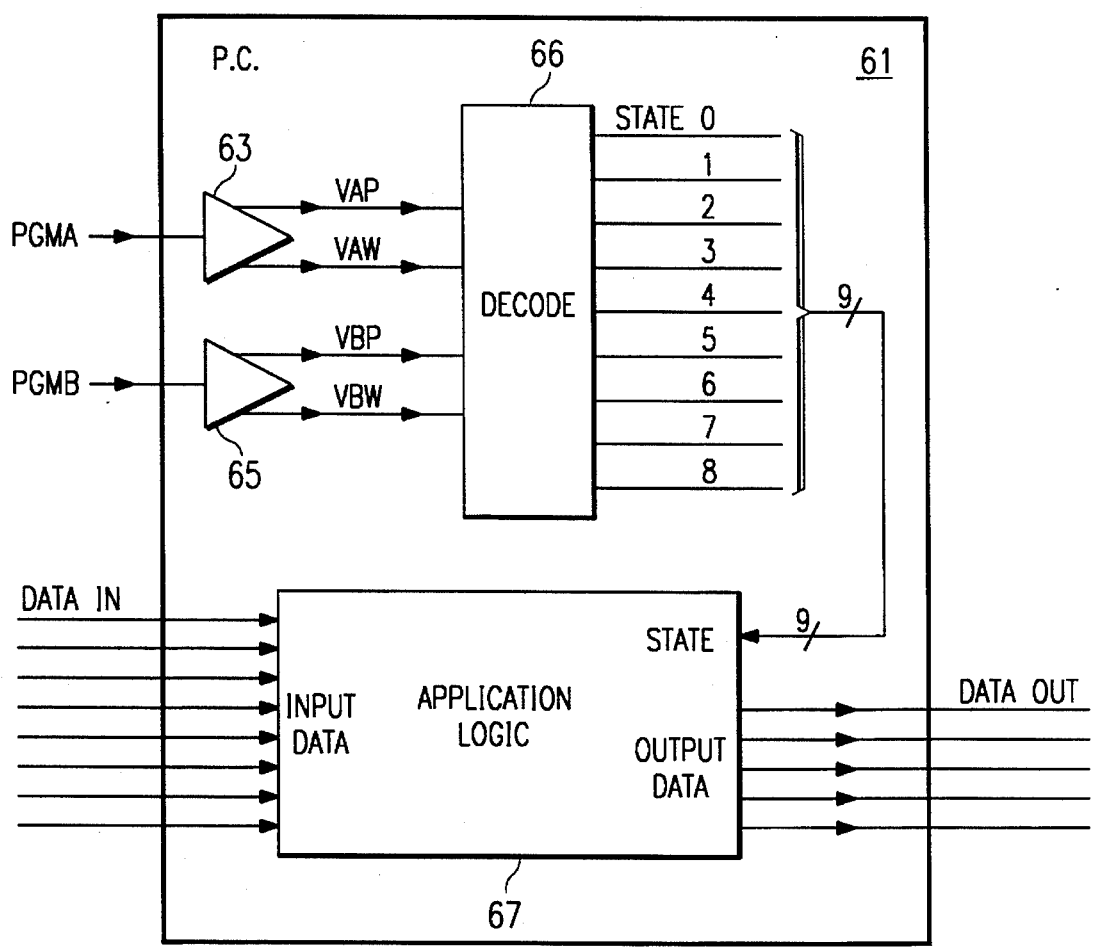
FIG. 9 depicts a circuit schematic for an integrated circuit that incorporates several of the trinary logic gates of the invention.

FIG. 9 depicts an integrated circuit 61 having nine initialization modes. The integrated circuit has two trinary input logic gates of FIG. 6, elements 63 and 65, coupled to two input pins, PGMA and PGMB. Decoder 66 is coupled to the two trinary logic inputs and produces 9 state variables as outputs. User defined application logic 67 is coupled to data input and data output busses DATAIN and DATAOUT respectively. User defined application logic 67 can implement any desired function where certain set up parameters are required at power up or initialization, for example a UART controller, terminal controller, video controller, RAM, ROM, state machine, processor, microprocessor, PC power monitoring device, fault logging circuit, maintenance controller device, etc.

In operation, the use of the two trinary input gates 63 and 65 of the preferred embodiment enables the device 61 to detect nine separate program pin input states STATE 0–8, so that a normal mode and eight extended modes of operation can be supported. This feature enables a variety of operations to be performed without requiring additional pins; so that the device can have many mode registers and control registers that are initialized at power up or at other key times to provide a flexible circuit for use in a wide variety of applications. To provide the same capability using standard binary logic input buffers would require four input pins as opposed to the two used here.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A trinary input logic gate, comprising:

a voltage input terminal;

a first voltage output terminal;

a second voltage output terminal;

a first output transistor coupling said first voltage output terminal to a first voltage reference, responsive to a first voltage at said voltage input terminal;

a second output transistor coupling said second voltage output terminal to a second voltage reference, responsive to a second voltage at said voltage input terminal; and swing limiting circuitry coupled to said voltage input terminal and operable to allow the voltage level at said voltage input terminal to range between a predetermined high voltage and a predetermined low voltage sufficient to keep both first and second output transistors enabled when no voltage is asserted at said voltage input terminal;

said first and second output transistors and said swing limiting circuitry being selected such that when no input signal is asserted at said voltage input terminal, said first and second output terminals are at opposite polarities thereby indicating that said voltage input terminal is an open circuit.

2. The circuitry of claim 1, also comprising:

a first current source coupled between said first output voltage terminal and said second voltage reference, said first output terminal being pulled to the voltage level of said second voltage reference by said first current source when said first output transistor is disabled.

3. The circuitry of claim 2, and further comprising:

a second current source coupled between said second output terminal and said first voltage reference, said second output terminal being pulled to the voltage level of said first voltage reference when said second output transistor is disabled.

4. The circuitry of claim 2, wherein said first output transistor comprises a P channel MOS transistor having its conductive path coupled between said first voltage reference and said first output terminal, and having its gate terminal coupled to the input voltage terminal.

5. The circuitry of claim 3, wherein said second output transistor comprises a N channel MOS transistor having its conductive path coupled between said second voltage reference and said second output terminal, and having its gate terminal coupled to the input voltage terminal.

6. The circuitry of claim 1 and further comprising an input decoupling capacitor coupled between said voltage input terminal and said ground voltage reference for removing transient signals from said voltage input terminal.

7. The circuitry of claim 1, wherein said swing limiting circuitry comprises:

a first current source coupled to a first bias supply terminal for supplying a predetermined constant current;

a first swing limiting transistor coupling said voltage input terminal to said first current source, and having a gate terminal coupled to said voltage input terminal;

a second current source coupled to a second bias supply terminal for supplying a predetermined constant current; and a second swing limiting transistor coupling said voltage input terminal to said second current source, and having a gate terminal coupled to said voltage input terminal;

said first and second swing limiting transistors being selected such that when there is no voltage being applied at the voltage input terminal, the voltage input terminal has a maximum voltage that is less than a first predetermined threshold and a minimum voltage that is greater than a second predetermined threshold.

8. The circuitry of claim 7, wherein said first predetermined threshold is less than the shut off voltage of said first output transistor, and said second predetermined threshold is greater than the shut off voltage of said second output transistor.

9. The circuitry of claim 7 wherein said first swing limiting transistor is a diode connected P-channel MOS transistor.

10. The circuitry of claim 7 wherein said second swing limiting transistor is a diode connected N-channel MOS transistor.

11. The circuitry of claim 7, wherein said first and second current sources comprise P-channel MOS and N-channel MOS transistors, respectively.

12. A method of providing a trinary logic input, comprising:

providing a voltage input terminal;

providing a first output terminal;

providing a second output terminal;

providing a first output transistor which couples said first output terminal to a first voltage reference, responsive to a first voltage on said voltage input terminal;

providing a second output transistor which couples said second output terminal to a second voltage reference, responsive to a second voltage on said voltage input terminal;

providing a swing limiting circuit coupled to said voltage input terminal which maintains a midrange voltage on said voltage input terminal when no voltage is asserted at said voltage input terminal, said midrange voltage being selected so that both said first and second output transistors are enabled; and operating said first and second output transistors and said swing limiting circuit so that when no voltage is asserted at said voltage input terminal, the voltages at said first and second output terminals are of opposite polarities, indicating that said voltage input terminal is an open circuit.

13. The method of claim 12 and further comprising the step of providing an input decoupling capacitor coupled between said voltage input terminal and said ground voltage reference for removing transient signals from said voltage input terminal.

14. The method of claim 12 and further comprising the step of providing a logic gate coupled to said first and second output terminals for comparing said first and second output terminals and outputting a comparison signal.

15. The method of claim 12 and further comprising the steps of:

providing a first current source coupled between said first output voltage terminal and said second voltage reference, said first output terminal being pulled to the voltage level of said second voltage reference by said current source when said first output transistor is disabled.

16. The method of claim 15, and further comprising the steps of:

providing a second current source coupled between said second output terminal and said first voltage reference, said second output terminal being pulled to the voltage level of said first voltage reference when said second output transistor is disabled.

17. The method of claim 12, wherein said step of providing a first output transistor comprises providing a P channel MOS transistor having its conductive path coupled between said first voltage reference and said first output terminal, and having its gate terminal coupled to the input voltage terminal.

18. The method of claim 12, wherein said step of providing a second output transistor comprises providing an N channel MOS transistor having its conductive path coupled between said second voltage reference and said second output terminal, and having its gate terminal coupled to the input voltage terminal.

19. The method of claim 12, wherein said step of providing a swing limiting circuit comprises the steps of:

providing a first current source coupled to a first bias supply terminal for supplying a predetermined constant current;

providing a first swing limiting transistor coupling said first current source to said voltage input terminal, and having a gate terminal coupled to said voltage input terminal;

providing a second current source coupled to a second bias supply terminal for supplying a predetermined constant current;

providing a second swing limiting transistor coupling said voltage input terminal to said second current source, and having a gate terminal coupled to said voltage input terminal; and selecting said first and second current sources and first and second swing limiting transistors such that when there is no voltage being applied at the voltage input terminal, the voltage input terminal has a maximum voltage that is less than a first predetermined threshold and a minimum voltage that is greater than a second predetermined threshold.

20. The method of claim 19, wherein said step of selecting said first and second current sources and first and second swing limiting transistors further comprises the step of setting said first predetermined threshold less than the shut off voltage of said first output transistor, and setting said second predetermined threshold greater than the shut off voltage of said second output transistor.

21. The method of claim 19, wherein said steps of providing said first current source and said second current source each further comprise providing MOS transistors.

22. The method of claim 19 wherein said step of providing said first swing limiting transistor comprises providing a diode-connected P channel MOS transistor.

23. The method of claim 19 wherein said step of providing said second swing limiting transistor comprises providing a diode-connected N channel MOS transistor.

24. The method of claim 14 wherein said step of providing a logic gate comprises providing an exclusive OR gate coupled to said first and second output terminals.

25. The method of claim 14, and further comprising the step of coupling said compare signal to fault detection circuitry, said compare signal indicating an open condition at said voltage input terminal.

\* \* \* \* \*

UNITED STATES PATENT AND TRADEMARK OFFICE
CERTIFICATE OF CORRECTION

PATENT NO. : 5,457,411
DATED : October 10, 1995
INVENTOR(S) : R. Alan Hastings

It is certified that error appears in the above-indentified patent and that said Letters Patent is hereby corrected as shown below:

Col. 2, line 53, change "$(Vi>Vi_L, Vo>Vo_L)$" to $--(Vi<Vi_L, Vo<Vo_L)--$.

Col. 7, line 30, change "$V_{o2}$" to $--V_{o1}--$.

Col. 8, line 39, in equation [12], change "<" (both occurrences) to -->--.

Col. 8, line 48, in equation [13] bottom expression, change "$\dfrac{2I_1}{k_2}$" to $--\dfrac{2I_2}{k_2}--$ Signed and Sealed this Fifth Day of November, 1996

Attest:

BRUCE LEHMAN

*Attesting Officer*   *Commissioner of Patents and Trademarks*